(12) United States Patent
Chen et al.

(10) Patent No.: US 10,204,911 B2
(45) Date of Patent: Feb. 12, 2019

(54) METHOD FOR FABRICATING CAPACITOR

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chieh-Te Chen, Kaohsiung (TW); Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/859,763

(22) Filed: Jan. 2, 2018

(65) Prior Publication Data

US 2018/0197863 A1    Jul. 12, 2018

(30) Foreign Application Priority Data

Jan. 6, 2017 (CN) .......................... 2017 1 0011359

(51) Int. Cl.

| H01L 21/033 | (2006.01) |
| H01L 21/311 | (2006.01) |
| H01L 27/108 | (2006.01) |
| H01L 21/02 | (2006.01) |
| H01L 49/02 | (2006.01) |
| H01L 21/027 | (2006.01) |

(52) U.S. Cl.
CPC ...... *H01L 27/1085* (2013.01); *H01L 21/0217* (2013.01); *H01L 21/0274* (2013.01); *H01L 21/02164* (2013.01); *H01L 21/0332* (2013.01); *H01L 21/0337* (2013.01); *H01L 21/31144* (2013.01); *H01L 27/10817* (2013.01); *H01L 27/10852* (2013.01); *H01L 28/87* (2013.01); *H01L 28/91* (2013.01)

(58) Field of Classification Search
CPC ............. H01L 21/0274; H01L 21/0332; H01L 21/0337; H01L 21/10852

See application file for complete search history.

(56) References Cited

U.S. PATENT DOCUMENTS

| 7,429,536 B2 | 9/2008 | Abatchev |
| 2012/0009523 A1* | 1/2012 | Lee ..................... H01L 21/0337 430/312 |
| 2016/0293419 A1* | 10/2016 | Nam ..................... H01L 23/528 |

* cited by examiner

*Primary Examiner* — Daniel P Shook
(74) *Attorney, Agent, or Firm* — Winston Hsu

(57) ABSTRACT

A method for fabricating a capacitor includes providing a substrate and a first etching stop layer on the substrate; forming a plurality of first spacers on the first etching stop layer; forming an organic layer and a second etching stop layer sequentially on the first spacers, the organic layer covering the first spacers; forming a plurality of second spacers on the second etching stop layer, each second spacer crossing the first spacers; transferring a pattern of the second spacers to the organic layer to form an organic pattern; performing an etching process using the organic pattern and the first spacers as a mask to form an etching stop pattern and remove the second etching stop layer; transferring the etching stop pattern to the substrate to form a plurality of through holes.

13 Claims, 10 Drawing Sheets

METHOD FOR FABRICATING CAPACITOR

BACKGROUND OF THE INVENTION

1. Field of the Invention

The present invention relates to a method for fabricating a capacitor, and more particularly to a method for fabricating a capacitor of a dynamic random access memory (DRAM).

2. Description of the Prior Art

With the advanced technology, size of DRAM is getting smaller and smaller. Recent design is to fabricate the capacitors as tall as enough and as thin as enough and to arrange them as a matrix, so as to accommodate more capacitors and maintain a certain capacitance in a chip area when the chip area is gradually reduced. For this reason, there is a need to fabricate through holes with high aspect ratio in a sacrificial layer and arrange them as matrix and followed by forming a bottom electrode in the through holes with high aspect ratio and then forming a capacitor dielectric material and a top electrode on the bottom electrode. However, the step for fabricating the through holes with high aspect ratio is quite complicated, so to continuously simplify the fabricating method of the capacitor is still in need in the art.

SUMMARY OF THE INVENTION

It is therefore an objective of the present invention to provide a method for fabricating a capacitor to simplify the manufacturing steps of the capacitor.

An embodiment of the present invention provides a method for fabricating a capacitor including the following steps. A substrate and a first etching stop layer are provided. The first etching stop layer is disposed on the substrate. Next, a plurality of first spacers are formed on the first etching stop layer and followed by sequentially forming a first organic layer and a second etching stop layer on the first spacers. The first organic layer covers the first spacers. Then, a plurality of second spacers are formed on the second etching stop layer, and each second spacer crosses the first spacers. Thereafter, a pattern of the second spacers is transferred to the first organic layer to form an organic pattern. Later, a first etching process using the organic pattern and the first spacers as a mask is performed to etch the first etching stop layer and remove the second etching stop layer, so as to form a first etching stop pattern and followed by transferring the first etching stop pattern to the substrate to form a plurality of through holes. The through holes are spaced apart from each other.

In the method of the present invention, the spacers extending along two different directions can be formed through forming the tri-layer structures on the etching stop layers, and since the etching selectivity ratio of the advanced pattern and the etching stop layer relative to the sacrificial layer is high, the pattern of the spacers can be effectively transferred to the sacrificial layer with relative high thickness. Accordingly, not only the through holes with high aspect ratio can be accurately formed, but also the steps for fabricating the through holes can be simplified.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
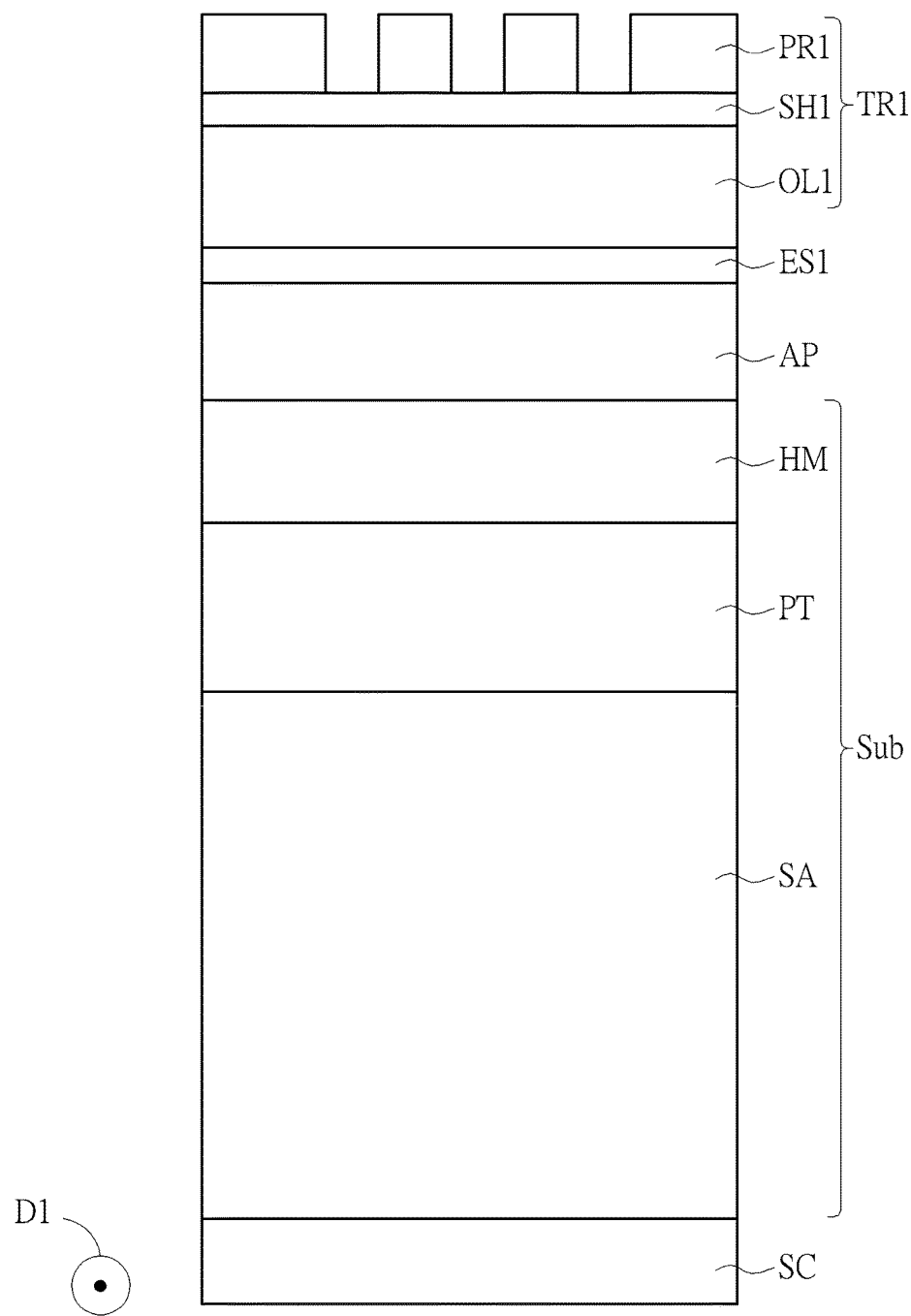
FIGS. 1-14 are schematic diagrams illustrating a method for fabricating a capacitor according to an embodiment of the present invention.

Please refer to FIGS. 1-14, which are schematic diagrams illustrating a method for fabricating a capacitor according to an embodiment of the present invention. First, as shown in FIG. 1, a substrate Sub and an etching stop layer ES1 are provided. The etching stop layer ES1 is disposed on the substrate Sub. In this embodiment, the substrate Sub may be a substrate including transistors, word lines, bit lines (not shown) and storage node contacts SC, so as to form through holes in the substrate Sub through the method of this embodiment and further form the capacitor on each storage node contact SC. The structures of transistors, word lines, bit lines and storage node contacts SC, the related positions between them and related variant designs is known by one of the skilled in the art and will not be detailed in the following description. In this embodiment, an advanced patterning film AP may be selectively provided between the substrate Sub and the etching stop layer ES1. The advanced patterning film AP may include amorphous carbon, and the etching selectivity ratio of the advanced patterning film AP relative to the etching stop layer ES1 and the substrate Sub is high.

In this embodiment, the substrate Sub may further include a sacrificial layer SA, a pattern transferring layer PT and a hard mask layer HM sequentially stacked on the storage node contact SC. The sacrificial layer SA may be configured to form the through holes with high aspect ratio therein, so a thickness of the sacrificial layer SA is greater than a thickness of the pattern transferring layer PT and a thickness of the hard mask layer HM. Additionally, the sacrificial layer SA may be a multilayer structure, for example, the multilayer may include a stack of silicon nitride, oxide, silicon carbonitride (SiCN), oxide and silicon carbonitride, in which the silicon carbonitride may serve as a supporting layer, the silicon nitride may serve as an etching stop layer, but not limited thereto. The pattern transferring layer PT may be configured to transfer a pattern of the hard mask layer HM to the sacrificial layer SA, and the pattern transferring layer PT may include the material different from the hard mask layer HM and the sacrificial layer SA accordingly, for example the pattern transferring layer PT may include amorphous silicon, and the hard mask layer HM may include silicon oxide.

Figure 2:
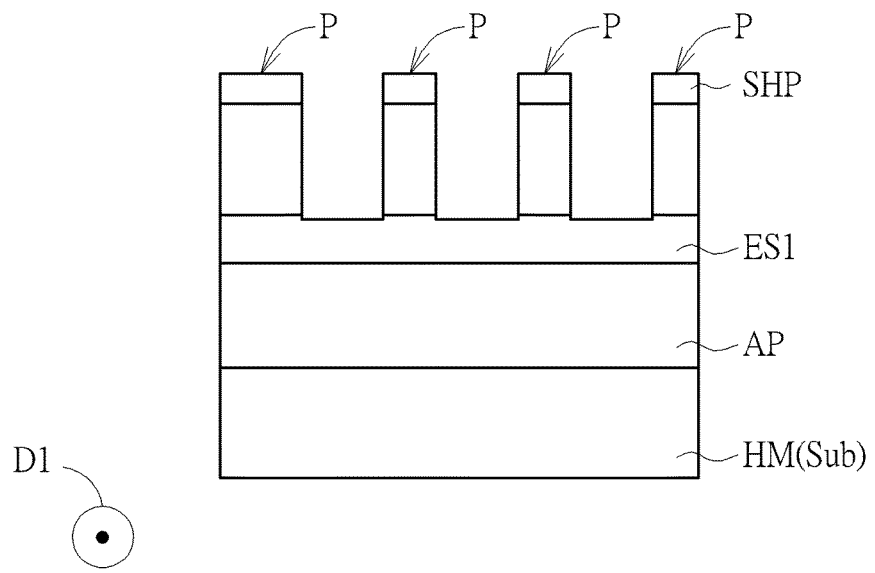

After providing the substrate Sub and the etching stop layer ES1, a plurality of spacers SP1 are formed on the etching stop layer ES1, in which each spacer SP1 extends along a first direction D1. Specifically, as shown in FIG. 1, a tri-layer structure TR1 is formed on the etching stop layer ES1. In this embodiment, the tri-layer structure TR1 may include an organic layer OL1, a silicon-containing layer SH1 and a photoresist pattern PR1 sequentially stacked on the etching stop layer ES1. The silicon-containing layer SH1 may be for example a silicon-containing hard mask bottom anti-reflective coating (SHB) layer for reduce reflection between the photoresist layer and the substrate Sub. The photoresist pattern PR1 may be formed by patterning the photoresist layer through a photolithography process. Next, as shown in FIG. 2, an etching process is performed to the silicon-containing layer SH1 using the photoresist pattern PR1 as a mask, so as to transfer the photoresist pattern PR1 to the silicon-containing layer SH1 and form a silicon-containing pattern SHP. After that, another etching process is performed to the organic layer OL1 using the silicon-containing pattern SHP as another mask, so as to transfer the silicon-containing pattern SHP to the organic layer OL1 and form a plurality of stripe mask patterns P extending along the first direction D1 and on the etching stop layer ES1 that. Also, the photoresist pattern PR1 is removed. The photoresist pattern PR1 may be removed before etching the organic layer OL1 or together with the step of etching the organic layer OL1. Since the etching selectivity ratio of the silicon-containing layer SH1 relative to the photoresist layer and the organic layer OL1 is high, the silicon-containing layer SH1 can serve as a mask for etching the organic layer OL1 having thicker thickness, and the pattern of the silicon-containing layer SH1 with thinner thickness can be accurately transferred to the organic layer OL1. Accordingly, there is no need to increase the thickness of the photoresist layer for having a mask function. For example, the thickness of the silicon-containing layer SH1 may be less than that of the photoresist layer, and the thickness of the photoresist layer may be less than the thickness of the organic layer OL1. For clearly showing the following steps, FIGS. 2-8 omit films under the pattern transferring layer PT, and FIGS. 9-10 omit films under the sacrificial layer SA, but the present invention is not limited herein.

Figure 3:
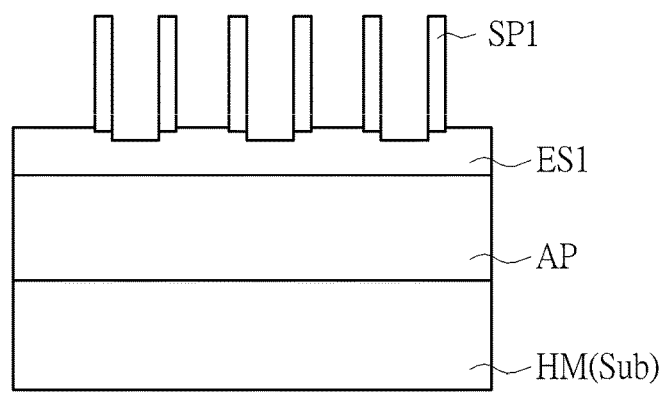

As shown in FIG. 3, a spacer material, such as silicon oxide, is conformally formed on the stripe mask patterns P and the etching stop layer ES1. Then, an etching back process is performed to form numerous spacers SP1 and expose the etching stop layer ES1. Thereafter, the stripe mask patterns P are removed, and each spacer SP1 having width less than exposure limit is left, so that each spacer SP1 can be configured to define a gap between the adjacent through holes in a second direction D2.

Figure 4:
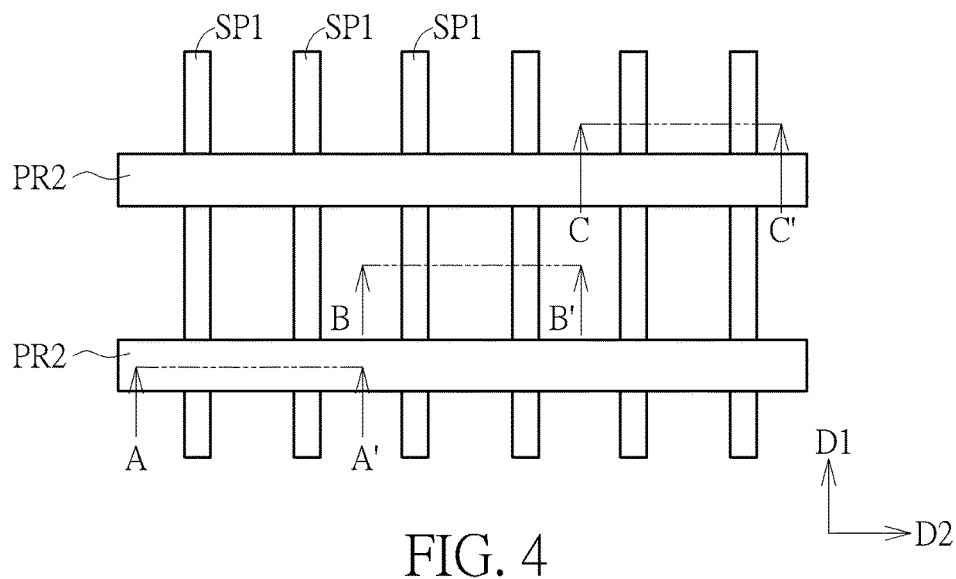
Figure 5:
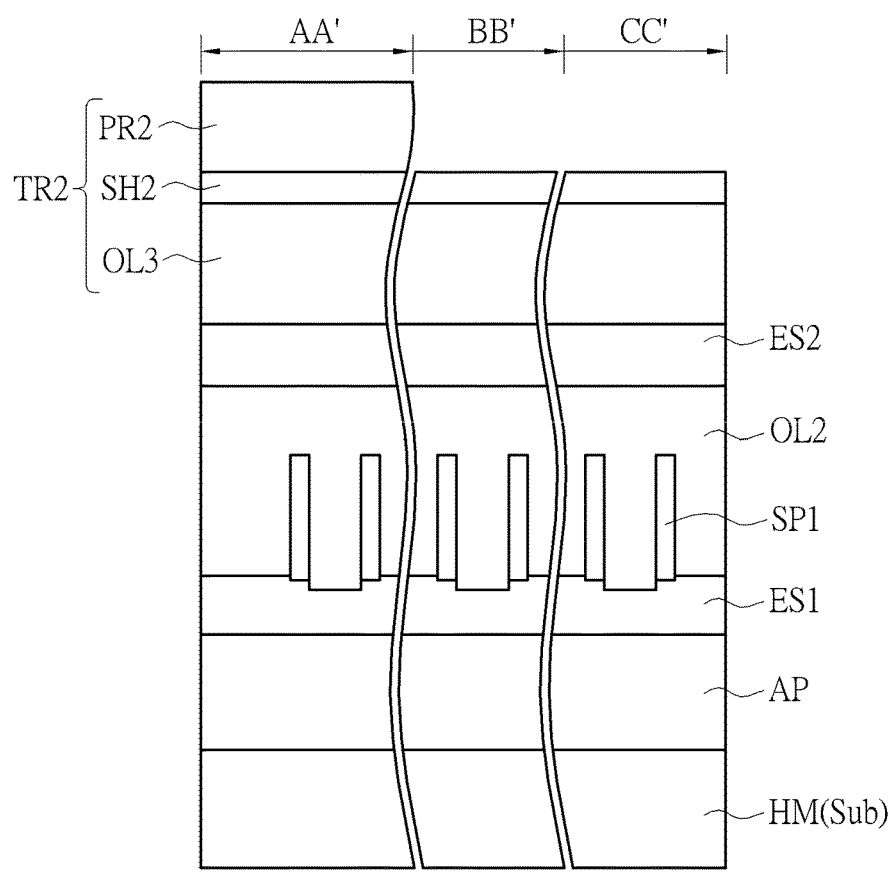

FIG. 4 schematically illustrates a top view of the photoresist pattern PR2 formed on the spacers SP1, FIG. 5 schematically illustrating a cross-sectional view taken along cross-sectional lines A-A', B-B', C-C' of FIG. 4, and FIG. 6 and FIGS. 8-14 schematically illustrating different stages corresponding to the cross-sectional lines A-A', B-B', C-C' of FIG. 4. As shown in FIG. 4 and FIG. 5, another organic layer OL2 and another etching stop layer ES2 are sequentially formed on the spacers SP1, in which the organic layer OL2 fills up the gaps between the spacers SP1 and covers the spacers SP1. Since the organic layer OL2 has excellent gap filling ability, the gaps between the spacers SP1 can be filled up and are kept from generating voids that would affect quality of following processes. Also, the organic layer OL2 may have a flat top surface which helps to perform the following steps of forming the spacers SP2.

Figure 6:
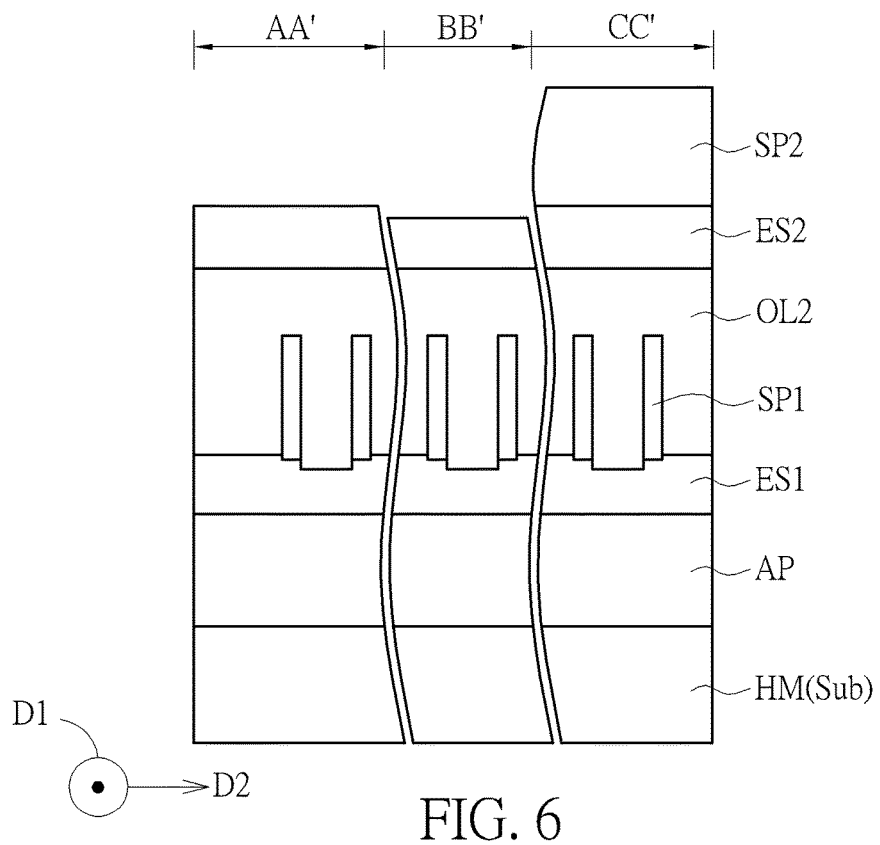
Figure 7:
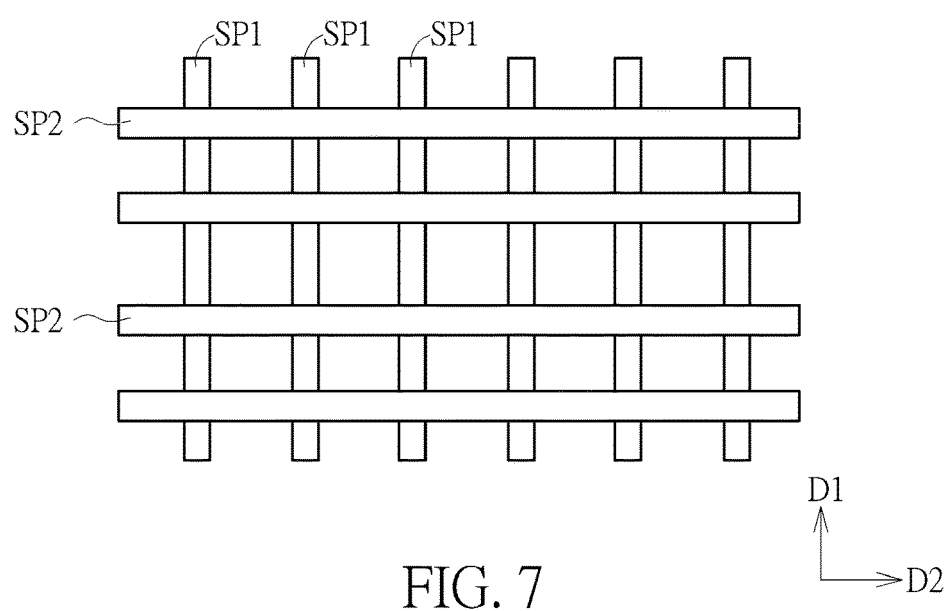

Later, a plurality of spacers SP2 are formed on the etching stop layer ES2, in which the spacers SP2 extend along the second direction D2 and cross the spacers SP1. In this embodiment, the step of forming the spacers SP2 may be the same as the step of forming the spacers SP1. Specifically, another tri-layer structure TR2 that is the same as the tri-layer structure TR1 may be formed on the etching stop layer ES2 and include another organic layer OL3, another silicon-containing layer SH2 and another photoresist pattern PR2 sequentially stacked on the etching stop layer ES2. The photo resist pattern PR2 may be formed by patterning another photoresist layer through another photolithography process. After that, as shown in FIG. 6, another etching process is performed to the silicon-containing layer SH2 using the photoresist pattern PR2 as another mask to transfer the photoresist pattern PR2 to the silicon-containing layer SH2 and form another silicon-containing pattern. Then, the silicon-containing pattern is transferred to the organic layer OL3 to form a plurality of stripe mask patterns extending along the second direction D2 and on the etching stop layer ES2, and the photoresist pattern PR2 is removed. Next, a spacer material, such as silicon oxide, is conformally formed on the stripe mask patterns and the etching stop layer ES2 and followed by performing an etching back process to form a spacer SP2 on each sidewall of each stripe mask pattern and expose the etching stop layer ES2. Thereafter, the stripe mask patterns are removed, and each spacer SP2 having width less than exposure limit is left, so that the size of each through hole can be defined by any two adjacent spacers SP1 and any two adjacent spacers SP2. As shown in FIG. 7, the spacers SP1 and the spacers SP2 perpendicularly cross each other, so each defined through hole is rectangular, but not limited thereto.

Figure 15:
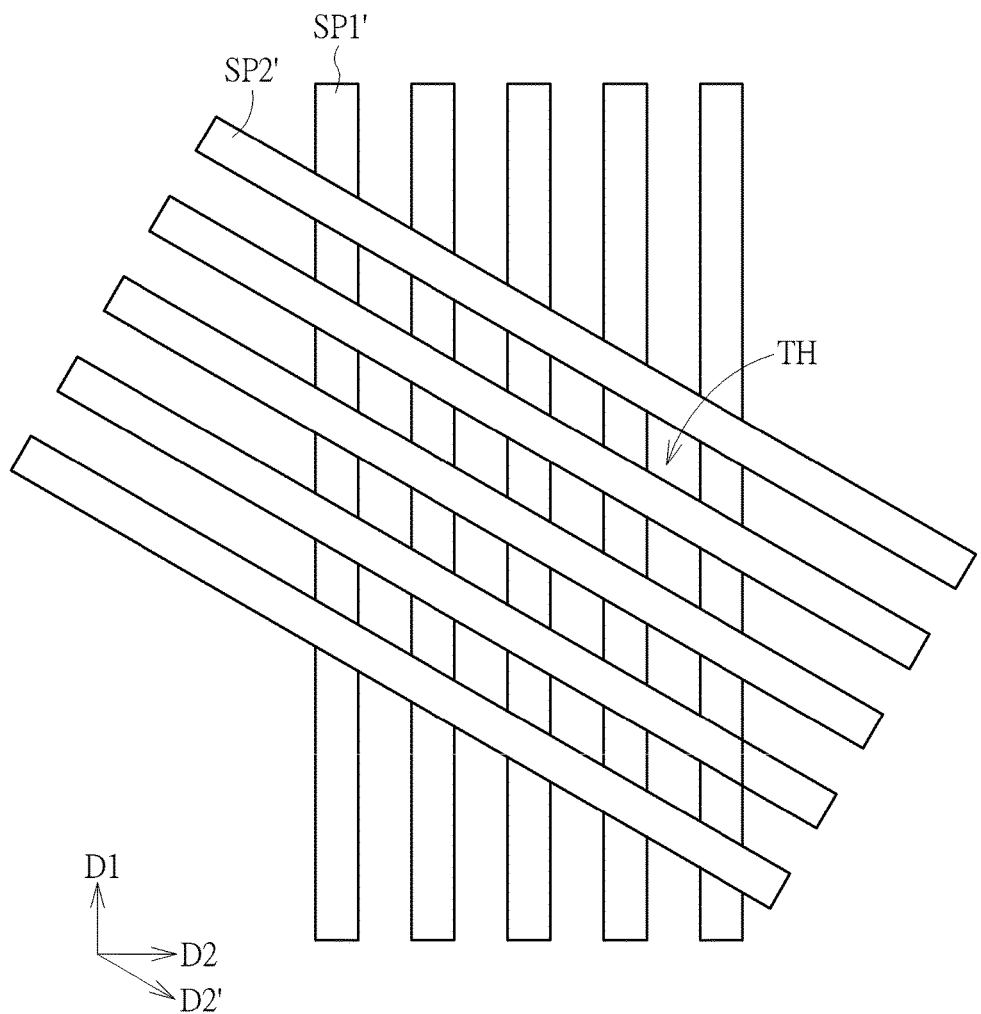
FIG. 15 is a schematic diagram illustrating a top view of an acute included angle between the spacers according to another embodiment of the present invention.
Figure 16:
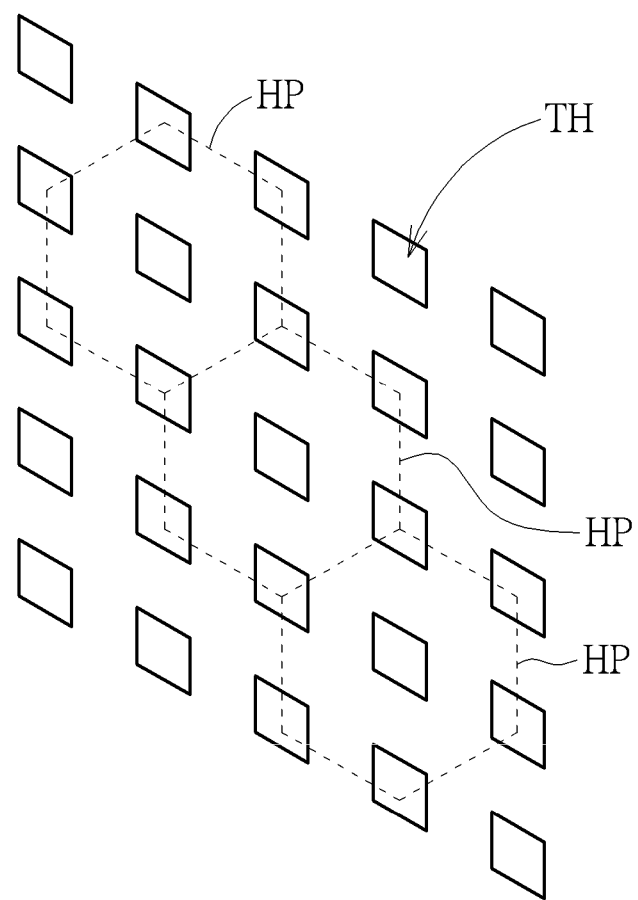
FIG. 16 is a schematic diagram illustrating an arrangement of the through holes according to another embodiment of the present invention.

In another embodiment, as shown in FIG. 15, the spacers SP1' may not be perpendicular to the spacers SP2'. For example, an included angle between an extending direction D2' of each spacer SP2' and the second direction D2 may be an acute angle. As shown in FIG. 16, the through holes may be arranged as a plurality of hexagon patterns.

Figure 8:
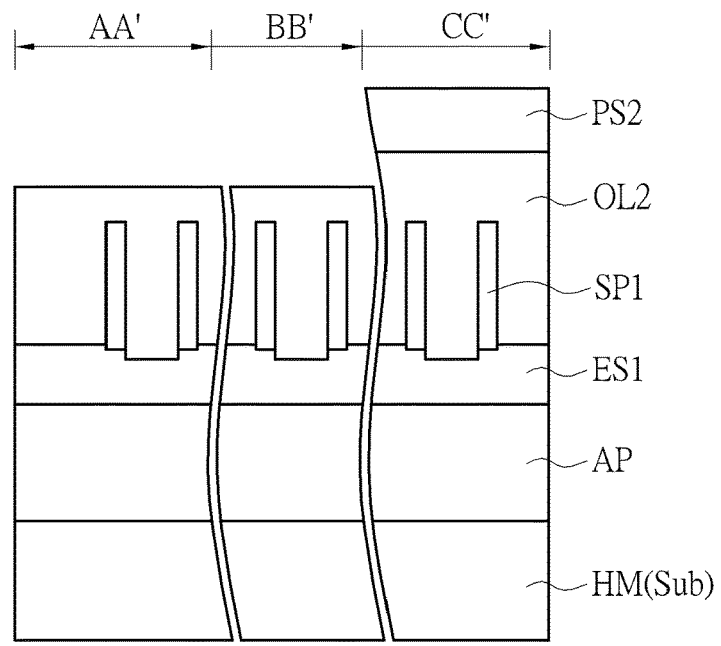
Figure 9:
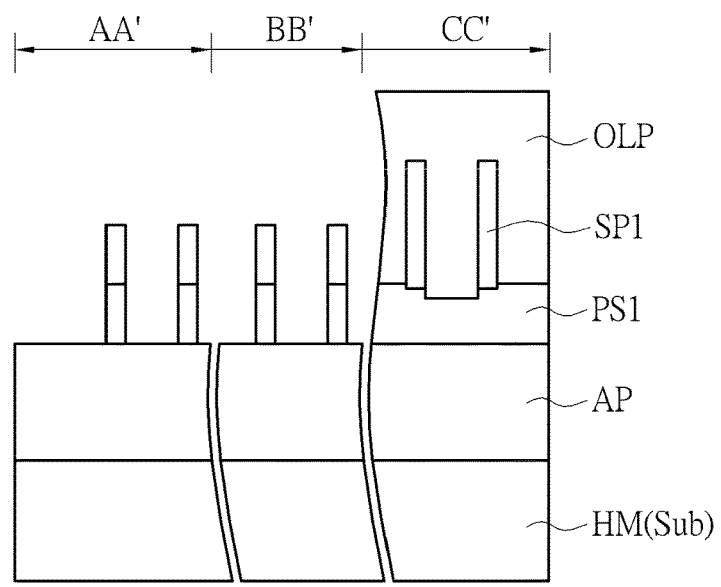

After the spacers SP2 are formed, the pattern of the spacers SP2 is transferred to the organic layer OL2. Specifically, as shown in FIG. 8, another etching process using the spacers SP2 as another mask is performed to etch the etching stop layer ES2, so as to form a second etching stop pattern PS2. The spacers SPE2 are removed subsequently. As shown in FIG. 9, another etching process using the second etching stop pattern PS2 as another mask is then performed to etch the organic layer OL2 so as to form an organic pattern OLP, and followed by performing another etching process using the organic pattern OLP and the spacers SP1 as another mask to etch the etching stop layer ES1 so as to form a first etching stop pattern PS1. Since the etching stop layer ES1 and ES2 may include the same material, such as silicon nitride, the second etching stop pattern PS2 is removed while forming the first etching stop pattern PS1. Also, a part of each spacer SP2 may be removed in the etching process.

Figure 10:
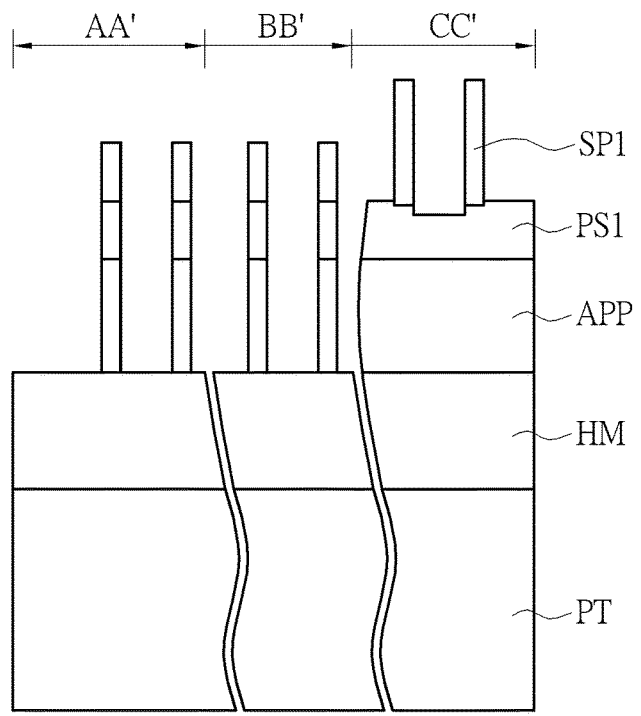
Figure 11:
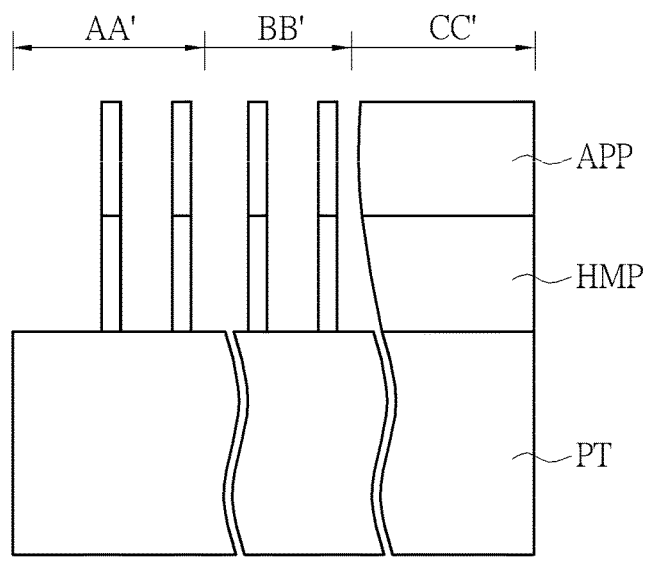

As shown in FIG. 10, another etching process using the first etching stop pattern PS1 is performed to etch the advanced patterning film AP, so as to form the advanced pattern APP and remove the organic pattern OLP. After that, as shown in FIG. 11, another etching process using the advanced pattern APP as another mask is performed to etch the hard mask layer HM, so as to form a hard mask pattern HMP. Since the hard mask layer HM has a certain depth, such as 2400 angstroms, the spacers SP1 and the first etching stop pattern SP1 are removed while etching the hard mask layer HM. By high etching selectivity ratio of the advanced pattern APP relative to the etching stop layer ES1 and the substrate Sub, the hard mask layer HM has greater thickness than the advanced pattern film AP can be etched through.

Figure 12:
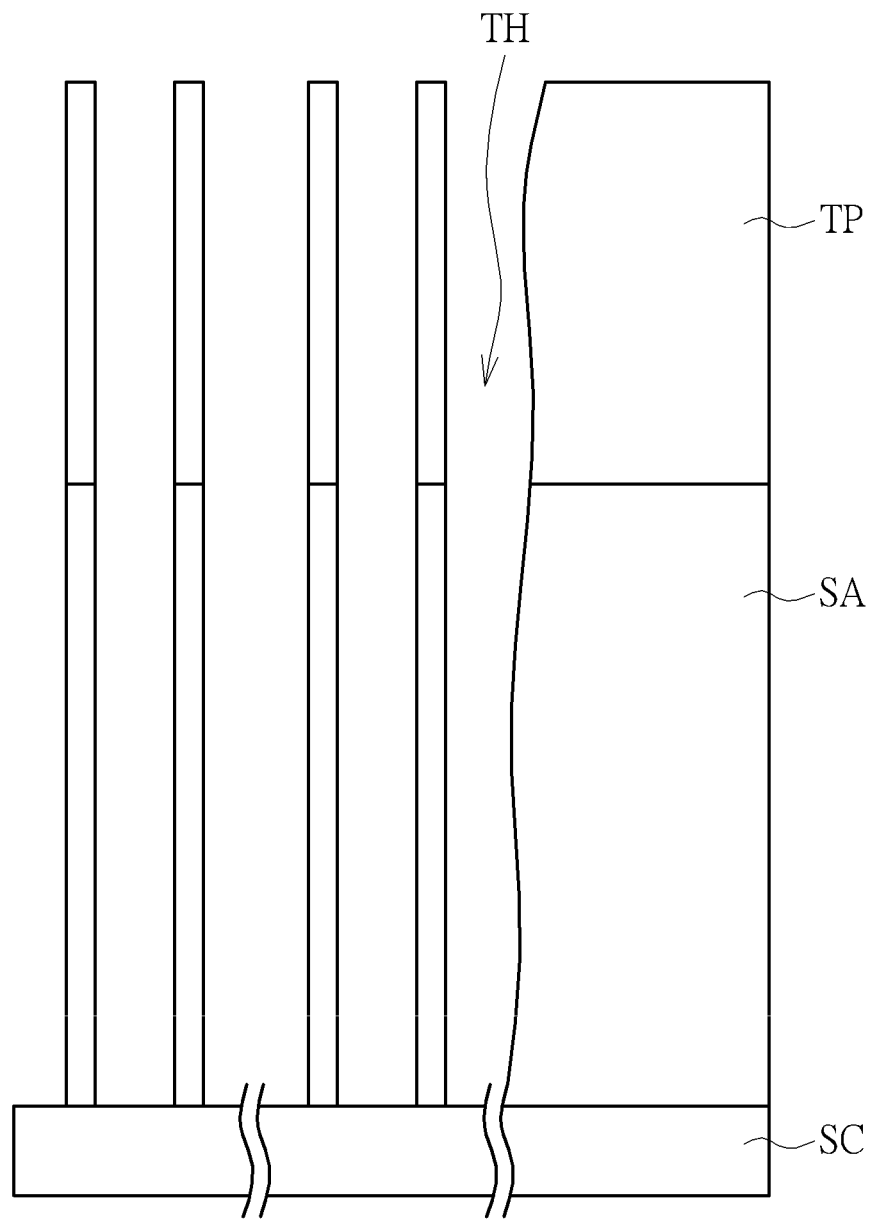

Subsequently, as shown in FIG. 12, the advanced pattern APP is removed and followed by performing another etching process using the hard mask pattern HMP as another mask to etch the pattern transferring layer PT, so as to form a transferring pattern TP. Then, another etching process using the transferring pattern TP as another mask is performed to form a plurality of through holes TH in the sacrificial layer SA and remove the hard mask pattern HMP. The through holes TH are spaced apart from each other, and each of which exposes a corresponding storage node contact SC respectively.

Figure 13:
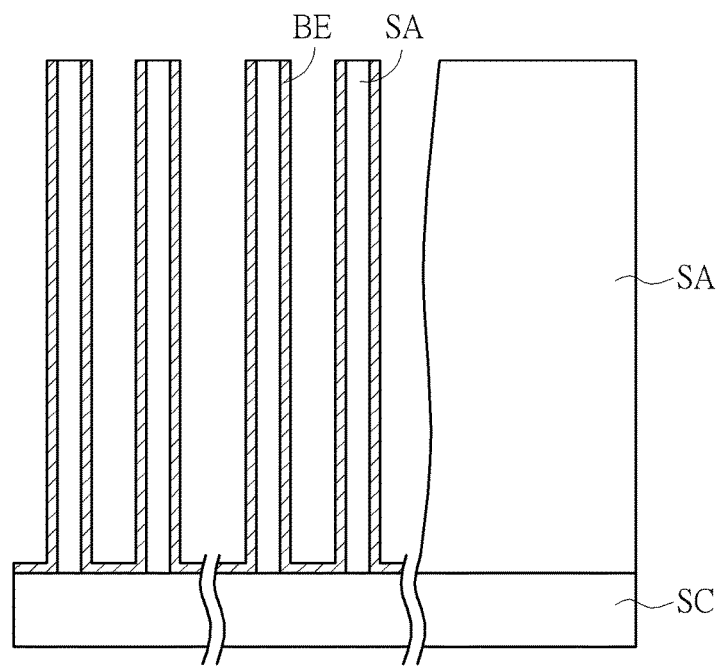
Figure 14:
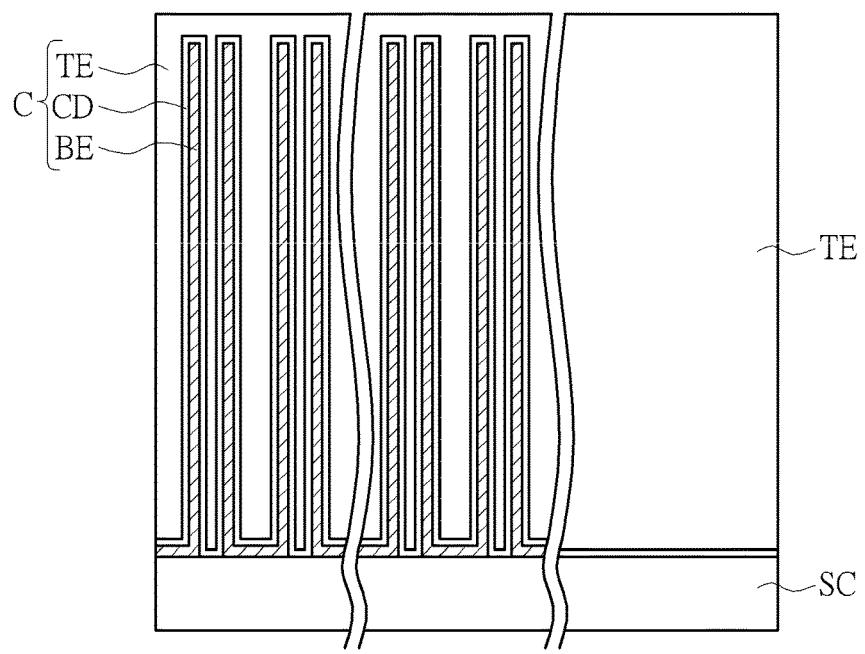

As shown in FIG. 13, a bottom electrode BE is formed in each through hole TH and followed by performing another etching process to remove the sacrificial layer SA. In another embodiment, the etching process may only remove silicon oxide in the sacrificial layer SA and leave silicon carbonitride for supporting, so that the bottom electrodes BE can be supported and kept from collapse. After that, as shown in FIG. 14, a capacitor dielectric layer CD is conformally formed on the bottom electrodes BE and followed by forming a top electrode on the capacitor dielectric layer CD, and the capacitor C is formed accordingly.

In summary, in the method of the present invention, the spacers extending along two different directions can be formed through forming the tri-layer structures on the etching stop layers, and since the etching selectivity ratio of the advanced pattern and the etching stop layer relative to the sacrificial layer is high, the pattern of the spacers can be effectively transferred to the sacrificial layer with relative high thickness. Accordingly, not only the through holes with high aspect ratio can be accurately formed, but also the steps for fabricating the through holes can be simplified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a capacitor, comprising the following steps:
   providing a substrate and a first etching stop layer, wherein the first etching stop layer is disposed on the substrate;
   forming a plurality of first spacers on the first etching stop layer;
   sequentially forming a first organic layer and a second etching stop layer on the first spacers, wherein the first organic layer covers the first spacers;
   forming a plurality of second spacers on the second etching stop layer, wherein each second spacer crosses the first spacers;
   transferring a pattern of the second spacers to the first organic layer to form an organic pattern;
   performing a first etching process using the organic pattern and the first spacers as a mask to etch the first etching stop layer and remove the second etching stop layer, so as to form a first etching stop pattern; and
   transferring the first etching stop pattern to the substrate to form a plurality of through holes, wherein the through holes are spaced apart from each other.

2. The method for fabricating the capacitor according to claim 1, further comprising providing an advanced patterning film disposed between the substrate and the first etching stop layer, wherein the advanced patterning film comprises amorphous carbon.

3. The method for fabricating the capacitor according to claim 2, wherein the substrate comprises a hard mask layer, and the step of transferring the first etching stop pattern to the substrate comprises:
   performing a second etching process using the first etching stop pattern as another mask to etch the advanced patterning film, so as to form an advanced pattern and remove the organic pattern; and
   performing a third etching process using the advanced pattern as another mask to etch the hard mask layer, so as to form a hard mask pattern and remove the first spacers and the first etching stop pattern.

4. The method for fabricating the capacitor according to claim 3, wherein the substrate further comprises a pattern transferring layer and a sacrificial layer, and the step of transferring the first etching stop pattern to the substrate further comprises:
   removing the advanced pattern;
   performing a fourth etching process using the hard mask pattern as another mask to etch the pattern transferring layer, so as to form a transferring pattern; and
   performing a fifth etching process using the transferring pattern as another mask to form the through holes in the sacrificial layer and remove the hard mask pattern.

5. The method for fabricating the capacitor according to claim 4, further comprising:
   removing the transferring pattern;
   forming a bottom electrode in each through hole respectively;
   removing the sacrificial layer;
   forming a capacitor dielectric layer conformally on the bottom electrode; and
   forming a top electrode on the capacitor dielectric layer.

6. The method for fabricating the capacitor according to claim 1, wherein the step of forming the first spacers comprises:
   forming a tri-layer structure on the first etching stop layer, wherein the tri-layer structure comprises a second organic layer, a first silicon-containing layer and a photoresist pattern sequentially on the first etching stop layer;
   transferring the photoresist pattern to the silicon-containing layer to form a silicon-containing pattern;
   transferring the silicon-containing pattern to the second organic layer to form a plurality of stripe mask patterns and remove the photoresist pattern;
   forming a spacer material conformally on the stripe mask patterns and the first etching stop layer;
   performing an etching back process to form the first spacers on the sidewalls of the stripe mask patterns respectively and expose the first etching stop layer; and
   removing the stripe mask patterns.

7. The method for fabricating the capacitor according to claim 6, wherein the step of forming the second spacers is the same as the step of forming the first spacers.

8. The method for fabricating the capacitor according to claim 1, wherein an included angle between each first spacer and each second spacer is 90 degrees.

9. The method for fabricating the capacitor according to claim 1, wherein an included angle between each first spacer and each second spacer is an acute angle.

10. The method for fabricating the capacitor according to claim 9, wherein the through holes are arranged as a plurality of hexagon patterns.

11. The method for fabricating the capacitor according to claim 1, wherein the step of transferring the pattern of the second spacers to the first organic layer comprises:
    performing a sixth etching process using the second spacers as another mask to etch the second etching stop layer, so as to form a second etching stop pattern;
    removing the second spacers; and
    performing a seventh etching process using the second etching stop pattern as another mask to etch the first organic layer, so as to form the organic pattern.

12. The method for fabricating the capacitor according to claim 1, wherein the first etching stop layer and the second etching stop layer comprise silicon nitride.

13. The method for fabricating the capacitor according to claim 1, wherein each first spacer and each second spacer comprise silicon oxide.

\* \* \* \* \*